United States Patent [19]

Nilsson

[11] Patent Number: 4,573,103
[45] Date of Patent: Feb. 25, 1986

[54] COOLING DEVICE FOR ELECTRONIC COMPONENTS CONNECTED TO A PRINTED CIRCUIT BOARD BY A HOLDER

[75] Inventor: Per-Ove Nilsson, Bandhagen, Sweden

[73] Assignee: Telefonaktiebolaget L M Ericsson, Stockholm, Sweden

[21] Appl. No.: 576,123

[22] Filed: Feb. 2, 1984

[30] Foreign Application Priority Data

Feb. 18, 1983 [SE] Sweden ................................ 8300921

[51] Int. Cl.⁴ .............................................. H05K 7/20
[52] U.S. Cl. ..................................... 361/386; 361/414; 174/52 FP
[58] Field of Search ............................ 361/382–388, 361/400, 401, 414; 174/52 FP; 165/104.33, 80 B, 80 D; 339/17 CF, 112 R

[56] References Cited

U.S. PATENT DOCUMENTS

| | | | |
|---|---|---|---|
| 3,777,220 | 12/1973 | Tatusko | 361/386 |
| 4,037,270 | 7/1977 | Ahmann | 361/385 |
| 4,089,575 | 5/1978 | Grabbe | 174/52 FP |
| 4,390,220 | 6/1983 | Benasutti | 174/52 FP |
| 4,410,927 | 10/1983 | Butt | 361/414 |

*Primary Examiner*—G. P. Tolin
*Attorney, Agent, or Firm*—Roberts, Spiecens & Cohen

[57] ABSTRACT

A cooling device for electronic components connected to a printed circuit board (PCB) by holders comprising a heat-conductive body placed between the component and the PCB and engaging them. Heat is transferred to the PCB in this way, the PCB thus being used as a cooling system for the electronic components. The PCB may be provided with a metallic layer at its engagement surface with the heat-conductive body, or a recess can be made in the PCB so that the heat-conductive body comes into contact with a metal layer embedded in the PCB. The heat-conductive body may be firmly connected to the PCB by gluing or soldering and be connected to the holder by projections.

5 Claims, 5 Drawing Figures

COOLING DEVICE FOR ELECTRONIC COMPONENTS CONNECTED TO A PRINTED CIRCUIT BOARD BY A HOLDER

FIELD OF THE INVENTION

The invention relates to a cooling device for electronic components, connected to a printed circuit board (PCB) with the aid of holders.

BACKGROUND

Electronic components often generate large amounts of heat. In electronic components which are connected to a PCB with the aid of a holder it is known to conduct this heat away from the component with the aid of cooling fins. These are voluminous however, and it is difficult to obtain good thermal contact between the component and cooling fins. This causes difficulties in building compact systems where the components are placed closely together on the PCB and where the PCB's are mounted with small mutual spacing.

SUMMARY OF THE INVENTION

The aforementioned problems are solved in accordance with the invention by conducting heat from an electronic component, connected to a PCB by a holder, via a heat conductive body placed between the component and the PCB.

The invention is characterized by the incorporation of metal heat transfer means in the PCB comprising one of the layers thereof. The layer is in a position such that with a holder engaging the board, the electronic component is in heat transfer contact with the heat conductive body and the latter is in heat transfer contact with the heat transfer means so that heat is transfered from the component to the conductive body and then to the heat transfer means incorporated in the PCB and said one layer thereof.

BRIEF DESCRIPTION OF THE FIGURES OF THE DRAWING

A preferred embodiment of the invention will now be described in conjunction with the appended drawing, wherein.

DETAILED DESCRIPTION OF A BEST MODE FOR CARRYING OUT THE INVENTION

Figure 1:
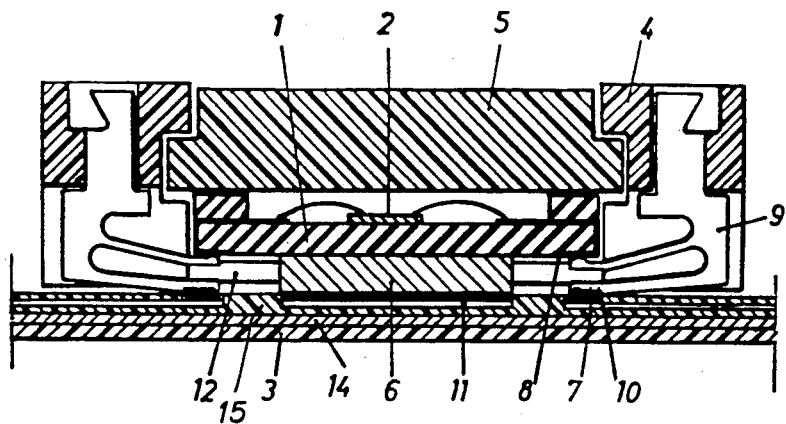
FIG. 1 illustrates the device in cross section.
Figure 2:
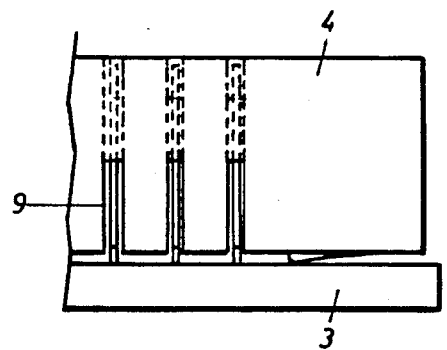
FIG. 2 illustrates the device in a side view.

FIG. 1 illustrates an electronic component 1 provided with an integrated circuit 2 and connected to a PCB 3 by a holder 4. The component is locked into the holder by a cover 5. Between the component 1 and the PCB there is a heat conductive body 6 located so as to dissipate the heat generated in the integrated circuit to the PCB. Electrical contact means are denoted by the numeral 9 and comprise a resilient plate with two projections. The upper of these projections makes contact with electrical connections 8 on the component, and the lower one with electrical conductors 7 in a layer 15 of the PCB via solder joints 10. FIG. 2 illustrates the contact means in a front view. To obtain good thermal contact between the PCB and the heat-conductive body 6, the latter is soldered to a metallic conductor 11 formed in layer 15 of the PCB in the same way as the conductors 7 and simultaneously therewith. Good heat conductive contact between the component and the heat conductive body is obtained by pressing their mutually opposing flat surfaces against each other by the cover 5. The PCB 3 is built up from several different layers having different functions. The PCB in accordance with the embodiment has a metal layer 14 with good heat-conductive ability enabling dissipation of the heat transmitted to the PCB through the body 6. Layer 14 can also serve as a mechanical carrier for the remaining layers of the board, and may furthermore participate in the electrical function, i.e. the current supply. Since the layer 14 is heat-conductive, the whole surface of the PCB may be used as a cooling means for the electronic components.

Figure 3:
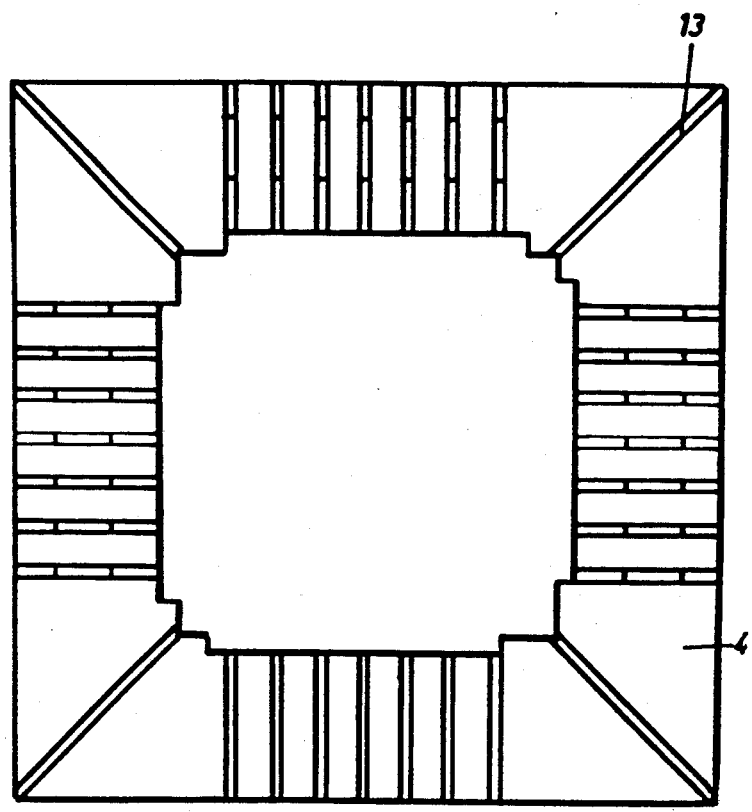
FIG. 3 illustrates the holder as seen from below.
Figure 4:
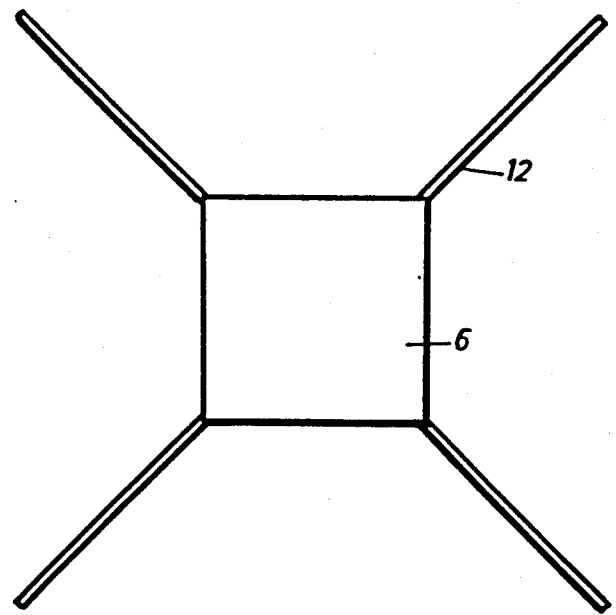
FIG. 4 illustrates the heat conductive body.

FIG. 3 illustrates the holder 4 from below. Grooves 13 are formed in the underside of the holder along its diagonals, and the heat-conductive body 6 may be fastened in these grooves by pressing the projections 12 (FIG. 4) of the body into the grooves. The heat-conductive body is thus given a desired location in the holder, which facilitates assembly on the PCB. The heat-conductive body also contributes in attaching the holder to the PCB by the body being soldered to the board.

Figure 5:
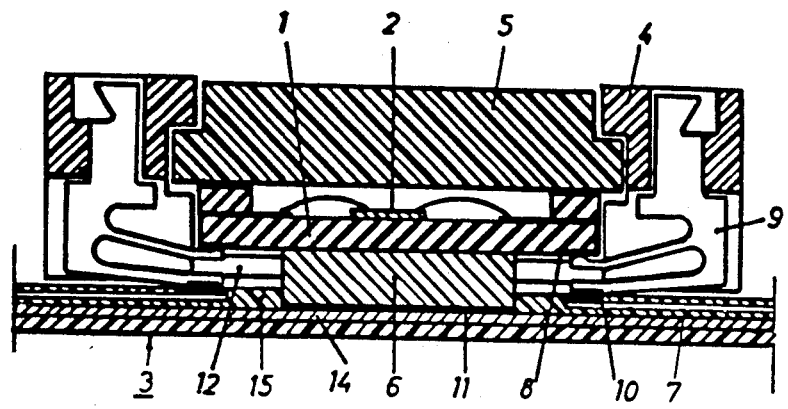
FIG. 5 illustrates a modification of the device in FIG. 1.

In accordance with the illustrated embodiment in FIG. 5, communication between the heat-conductive body 6 and the PCB is provided by soldering the former to metal layer 11 recessed in the circuit board. It is, of course, possible for the metal layer to be arranged at the surface of the PCB without any recess or as shown in FIG. 5 to make by the recess 20 so deep that the heat-conductive body 6 comes into contact with the metal layer 14 running through the entire PCB.

In a further embodiment, the heat-conductive body is connected to the PCB by gluing.

It is also possible merely to press the body against the PCB without any soldering or gluing. A heat-conductive plastic composition may then then be placed between these surfaces to improve the thermal contact.

The heat-conductive body in the illustrated embodiment is connected to the holder by projections on the body. This connection may also be afforded by projections on the holder.

What is claimed is:

1. A cooling system combined with an electronic component removably mounted on a multilayer printed circuit board by holder, said cooling system comprising a heat conductive body inserted in the holder and metal heat transfer means incorporated within said board and comprising one of the layers thereof in a position so that with the holder engaging said board, the electronic component is in heat transfer contact with the heat conductive body and the latter is in heat transfer contact with said heat transfer means such that heat is transferred from the component to the heat conductive body and then to the heat transfer means incorporated in said board and comprising said one layer thereof, said board comprising a further layer having a recess in which said heat conductive body is received, said further layer including electrical conductors therein, said holder including electrical contact means establishing electrical contact between said electronic component and said electrical conductors on said further layer with the holder engaged with said board and said heat conductive body, wherein said electrical contact means includes resilient projections engaging said component and said board for establishing said electrical contact between the component and the electrical conductors, said heat conductive body including further projections engaged in grooves provided in said holder for securing said heat conductive body in said holder, and means securing said heat conductive body to said board.

2. A cooling system as claimed in claim 1 wherein said heat transfer means further comprises a metal layer in said recess in contact with said heat conductive body.

3. A cooling system as claimed in claim 1 wherein said one layer is composed of metal and is juxtaposed with said further layer, said recess extending through said further layer such that with the holder engaging the board, the heat conductive body is engaged in said recess and contacts said one layer.

4. A cooling system as claimed in claim 1 wherein said heat conductive body has a flat surface which is in heat conductive contact with said heat transfer means.

5. A cooling system as claimed in claim 1 wherein said one layer is composed of metal and is coextensive with the board.

* * * * *